Oct. 10, 1967 J. GAYNOR 3,346,384

METAL IMAGE FORMATION

Filed April 25, 1963

Inventor:
Joseph Gaynor,
by John F. McDevitt
His Attorney.

United States Patent Office 3,346,384
Patented Oct. 10, 1967

3,346,384
METAL IMAGE FORMATION

Joseph Gaynor, Schenectady, N.Y., assignor to General Electric Company, a corporation of New York
Filed Apr. 25, 1963, Ser. No. 275,753
11 Claims. (Cl. 96—36)

This invention pertains generally to the preparation of an image in a metal layer. More particularly, the invention provides means for faithfully reproducing the details of projected radiation in a metal layer. Specifically, the present invention provides a way to convert portions of a metal layer with selective irradiation in order to produce an image in the metal having a point-by-point correspondence with the radiation received.

There is a wide variety of applications for which designs in a metal layer have already proved useful. Decorative designs in objects coated with a metal film are known. The lithographic art utilizes relief patterns mechanically produced in a metal layer. Alternately, the art of photoresist print-out selectively etches a metal layer to provide a relief copy of a projected optical image. It would be desirable to find a more direct, simple, and satisfactory method for producing designs in a metal layer.

It would be further desirable to form useful metal designs directly upon irradiation thereby eliminating any need for further processing. This can be accomplished through selective formation of metal compounds in a metal layer having dissimilar properties from the metal. For example, printed electrical circuits can be formed directly if upon exposure selective portions of the metal are converted to electrically resistive compositions. When the metals or conversion products exhibit semiconducting or photoconducting characteristics, it is also possible to produce other type conducting paths in a metal layer by this technique.

It is one important object of the invention, therefore, to record a design in a metal layer whereby useful products are formed directly upon exposure of the metal to a modulated pattern of activating radiation.

It is still another important object of the invention to record a relief image in a metal layer by selective conversion of metal in accordance with a projected pattern of activating radiation.

Still another important object of the invention is to record a stable transparent image in a thin metal film having full shade tones so as to be of general utility in the graphic arts.

Figure 1:
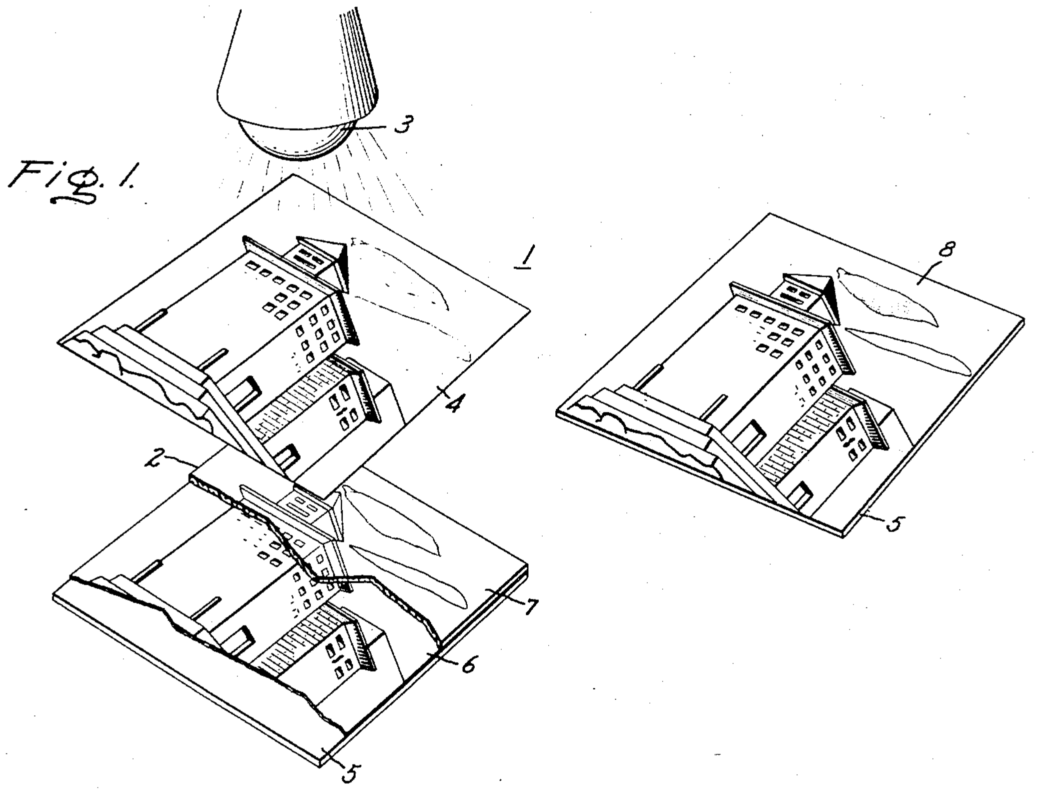
Figure 2:
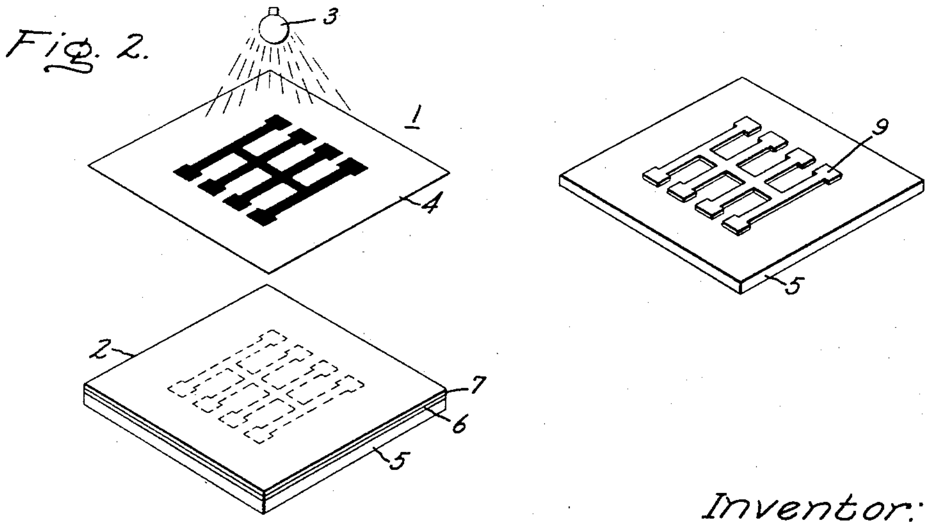

These and other important objects and advantages of the invention will be apparent from the following detailed description taken in connection with the accompanying drawings in which:

FIGURE 1 is a schematic representation of one preferred method for recording a transparent metal image; and FIGURE 2 illustrates schematically a preferred method for preparing a printed electrical circuit according to the invention.

Briefly, the present invention is practiced by exposing a metal layer coated with a photolytic-halogen generating compound to a selective pattern of activating radiation for a sufficient time period to convert exposed portions of the metal to a different chemical composition through reaction with the photolytic halogen generated by exposure. Useful radiation sensitive materials for the coating are polyhalogenated organic compounds which liberate halogen atoms under the influence of impinging radiation. The converted portions of the exposed metal layer have a point-by-point correspondence with the projected radiation so that true image reproduction is obtained directly upon exposure. Depending upon the final application for the selectively converted metal layer and such other considerations as whether the photosensitive coating has been discolored, the coating may be completely removed or otherwise rendered insensitive to further irradiation for preservation of the recorded image.

In one important application of the present invention, a metal relief image is obtained after exposure by completely removing the radiation-sensitive coating along with the conversion products from the metal layer. This may be accomplished readily with a single liquid solvent for both materials. Selective solvents for the individual constituents may also produce even better detail in the final relief image. In either case, it is worthwhile to point out that removal of the coating and irradiation products can be effected with noncorrosive liquids so that many problems now encountered with a conventional photoresist practice such as loss of film adhesion, undercutting, and only partial development of the image are thereby eliminated. The coating of polyhalogenated organic material and the conversion products formed upon exposure may also be removed by volatilization at elevated temperatures below the evaporation temperature of the particular metal employed. Alternately, the impedance to current flow exhibited by certain radiation sensitive coatings used in the practice of the invention and the conversion products formed in the metal layer therewith permits direct utilization of the exposed member as a printed electrical circuit without further processing. The electrically resistive nature of conversion products in a metal layer also enables direct fabrication of resistor elements in a printed circuit by practice of the invention.

In a different embodiment, a thin supported metal film coated with the polyhalogenated organic compound is selectively converted by activating radiation to produce a detailed image in the metal, which is a photographic transparency of the projected radiation. The original metal film may be deposited upon a transparent substrate to permit convenient observation of the recording by light projection through the entire member. Alternately, the metal film may be deposited upon an opaque support with the final image being viewed by reflected light after removal or fixing of the overlying photosensitive coating. With certain of the photosensitive coatings which develop color formation during the irradiation, it will be desirable to completely remove the coating to obtain an unobstructed view of the underlying metal image. Other optically transparent photosensitive coatings useful in the practice of the general process do not experience the color formation, however, and a clearly discernible metal image is produced immediately upon exposure. The image produced with the latter type coatings is fixed from further change with additional irradiation by removal of remaining photosensitive agent from the recording member. Removal of the residual photosensitive agent can be achieved readily by evaporation, solvent extraction, and other known chemical processing means.

A convenient process for preparing a metal transparency in the above described general manner comprises illuminating the recording member through a conventional photographic negative bearing the image to be recorded, and thereafter dissolving the coating along with reaction products from the metal film with a liquid solvent which does not dissolve the metal. The remaining transparent metal film contains a reproduction of the image on the photographic negative having all the detail, clarity, and full shade tones transmitted in the projected illumination.

Having described the invention generally, it may be practiced in its preferred embodiments as illustrated in the following description and subsequent specific examples thereon. Where parts and percentages appear hereinafter in the specification, the reference is to parts and percentages by weight unless otherwise specified.

In FIGURE 1 there appears schematically a pictorial representation of the present method for preparing a photographic transparency in a metal layer supported on a transparent substrate. A convenient recording arrangement 1 for copying a faithful reproduction of an already photographed subject may comprise a recording member of the invention 2, an illumination source 3, and an ordinary photographic negative 4 bearing the image to be copied. A suitable recording member may consist of transparent support layer 5 having an extremely thin but opaque film 6 of metal deposited on one major surface with a particular photosensitive coating 7 overlying the metal film. Representative composite elements for the recording member are more fully described in the specific examples which follow and subsequent discussion thereon.

The image on the photographic negative is transferred to the recording member in the embodiment by projecting illumination through the negative onto the facing photosensitive coating as depicted. Exposure of the photosensitive coating in this manner liberates photolytic halogen selectively in the light struck portions which reacts directly with the subjacent metal producing localized conversion therein in accordance with the light image pattern. If the original transparent coating undergoes substantial color formation during the irradiation, development of a clearly discernible visible image in the underlying metal film is accomplished in the embodiment simply by removing the photosensitive coating, together with the conversion products from the exposed recording member. Since both materials to be removed possess widely different physical properties from the metal, including solubility and thermal stability, the development can be achieved by such conventional practice as, for example, treating the exposed recording member with a selective liquid solvent for the now unwanted substances. Upon removal of the colored photosensitive coating and conversion products, there remains final metal image 8 on the original support layer. In the absence of substantial interfering color formation in the photosensitive coating during the exposure step, a readily observable and permanent metal image may be obtained by removing the residual photosensitive agent from the coating. It is interesting to note that with either modification of the described embodiment, a faithful reproduction of the photographic negative is produced having a light and shadow pattern which corresponds in a point-by-point location with the negative.

In FIGURE 2 there is shown schematically a different embodiment for producing a metal relief image of a printed electrical circuit. Since the same above described general recording arrangement can be employed to practice this embodiment, identical reference numerals have been retained to identify the corresponding members for simplicity of illustration. Accordingly, recording member 2 having support layer 5, metal layer 6, and overlying photosensitive coating 7 is exposed to illumination emitted from light source 3 through image-bearing photographic negative 4. The present embodiment may differ desirably in detail from the previously described embodiment, however, in the thickness of the metal layer and degree of subsequent photochemical conversion conducted therein. A metal layer of greater thickness than necessary for photographic reproduction may provide more desirable electrical conductivity characteristics in the particular intended application. It will also generally be desirable for thin film electrical circuit applications to provide a conducting path in the metal layer defined by exposed portions of an underlying dielectric substrate. For this result, it will be necessary to conduct the conversion reaction substantially throughout the thickness of the metal layer as distinct from limiting the reaction to mere contrast formation.

Illumination of the recording member in the above arrangement under the appropriate recording conditions produces selective conversion throughout the thickness of the metal layer in the light struck areas by the same general mechanism hereinbefore described. Likewise, removal of the photosensitive coating together with the conversion products in the metal layer, as previously described, leaves behind a final metal relief 9 of the circuit pattern on the original support layer.

*Example 1*

An electrical circuit may be produced in a supported silver layer according to the invention wherein a conducting path is defined by exposed portions of an underlying dielectrical substrate. In preparation, an approximately 950 angstrom thick uniform silver layer may be vapor deposited on a glass slide in an ordinary vacuum coater after cleaning the glass surface to remove grease and oxide contaminants therefrom. Contamination of the supporting surface generally produces undesirable effects in the metal layer including oxide formation and adherence loss which hinders formation of the desired result. In illustration of but one suitable cleaning process for glass slides, the dirt film may be removed with detergent, followed by a rinse in distilled water, an etch of the surface with ammonium bifluoride solution, a second rinse in distilled water, and a final acetone rinse. Interim storage of the cleaned slide in a dust-free environment insures good adherence of a silver layer to the glass surface.

The vapor deposited silver layer may be thereafter coated with an approximately 0.001 inch thick resin film containing iodoform to produce a photosensitive recording member in accordance with the invention. A suitable coating composition for this purpose consists of approximately 0.056 gram iodoform, 1.4 grams of a commercially available polystyrene material, and approximately 5.6 grams benzene. A solid film is used to facilitate handling of the recording member and may be obtained by evaporating solvent from the coating composition in a conventional manner. A satisfactory polystyrene material for the coating composition has an average molecular weight of approximately 20,000 and a softening temperature of about 85° C.

The solid recording member may be exposed to photoradiation in the circuit pattern for selective reaction of silver with photolytic iodine released from the iodoform in the coating. Exposure of the recording member for approximately 10 minutes to illumination from a 300-watt tungsten lamp projector in the circuit pattern being copied produces selective conversion throughout the silver layer. Modulation of the illumination used in recording can be achieved optionally at the illumination source or recording member by interposing a transparent image-bearing member to be copied in the light beam. For the present embodiment, sufficient illumination intensity was provided to complete the desired reaction with a projector location of approximately four to six inches from the recording member. In other contemplated applications involving different metal layers, polyhalogenated organic compounds, and radiation means, it will be obvious that different exposure conditions may be necessary for optimum results depending upon the reactivity of the particular materials employed, radiation intensity available, thickness of the metal layer, and possibly additional factors determining rates in chemical reactions.

Development of a metal relief having the desired circuit characteristics may be achieved by removing the photosensitive coating and silver iodide products produced in the above described manner. The resin coating is still soluble after irradiation and may be dissolved with benzene. An approximately 10 percent aqueous sodium thiosulfate solution may be employed to dissolve silver iodide from the silver layer. The positive metal relief produced by this treatment corresponds in all detail with the image contained on the photographic negative and a conducting path is defined in the metal by exposed portions of the glass substrate. Visual observation of the relief image reveals substantially no lateral attack or undercutting at the sites of metal removal with sharp line definition and excellent dimensional tolerances being obtained.

*Example 2*

A photographic transparency suitable for optical projection may be obtained in thin metal films by the general method of the invention. Copies of an image already contained on a photographic negative may be made in a metal film having all the detail, clarity, and shade tones of the negative. The image is most suitably prepared on metal films with a thickness ranging from around 50 angstroms to about 150 angstroms which is sufficient for image clarity under usual illumination without requiring rigorous processing conditions to prepare. At metal film thicknesses less than about 30 angstroms, an image formed therein lacks sufficient contrast to be readily discernible upon projection. Film thicknesses of around 100 angstroms and greater are opaque enough so that illumination projected through the film is not transmitted through portions which have not been converted during the recording process.

Accordingly, an approximately 120 angstroms thick film of tin may be vapor deposited on a glass slide by conventional vacuum coating technique. A radiation-sensitive coating is next applied to the tin surface from a liquid composition consisting of 0.056 gram iodoform and 1.2 grams of the polystyrene material dissolved in a mixture of 4.8 grams benzene with 1.5 grams acetone. Removal of organic solvents from the liquid film provides a solid recording member useful in preparation of the metal transparency. An image may be copied in the tin layer by exposure of the recording member for approximately one-half hour to projector illumination being transmitted through a conventional photographic color transparency having the image to be recorded. A permanent reproduction is thereby formed in the tin without need of further development to provide greater intensification, color change, or detail in the copy. Removal of the resin coating and tin iodide products from the recording member facilitates observation of the image formed in the tin layer. A convenient method of removal is contact with the same benzene and acetone mixture employed for the liquid coating composition which dissolves both materials to be removed but not the metal. The copy produced in the abovedescribed manner exhibits all the detail and shade tones contained in the original photographic transparency used. The results further indicate a resolution capability of recording at the molecular level so that the described process is deemed suitable for general photographic application including image reduction, microfilm, and the like. Relatively greater stability of metals compared to conventional photographic film under ordinary and even extraordinary environmental conditions also makes the present recording system a more permanent method of storing information.

*Example 3*

A printed electrical circuit may be produced in an approximately 110 angstroms thick supported layer of tin by the same general method described in Example 1. A suitable coating composition for the embodiment consists of 0.056 gram iodoform, 1.2 grams of the polystyrene material, 4.8 grams of benzene, and 1.5 grams of acetone. Complete conversion throughout the thickness of the tin layer is achieved after approximately one hour exposure to the projector illumination. A relief circuit may be developed in the exposed metal layer by removing the resin coating and the tin iodide conversion products with a benzene and acetone mixture. Alternately, electrical resistance measurements made in a tin layer before removal of the tin iodide products reveals a principal conduction path in the unconverted portions of tin. Thus, a satisfactory electrical circuit for some purposes can be established in the exposed metal even before removal of conversion products. For total restriction of electrical conduction to the path defined by residual metal in the layer, however, it will, of course, be necessary to remove the conversion products.

*Example 4*

To illustrate still other embodiments within contemplation of the invention, an electrical circuit pattern may be produced in a copper film of approximately 500 angstroms thickness by the same general method previously described. Accordingly, the copper layer may be vapor deposited on a dielectric support and given a photosensitive coating with a composition comprising 0.35 gram iodoform, 1.4 grams of the polystyrene material, and 5.6 grams benzene. After removal of the solvent from the coating, the solid recording member may be exposed to projector illumination in the desired circuit pattern for approximately 10 minutes which is a sufficient period of time for selective conversion throughout the thickness of the copper layer. The still soluble photosensitive coating may be dissolved from the exposed recording member with benzene. Cuprous iodide products in exposed portions of the copper film may be removed with a 10 percent aqueous potassium iodide solution to produce detailed relief image of the projected circuit pattern. The conducting path defined by the residual copper metal exhibits the uniform characteristics produced in the preceding examples.

*Example 5*

In a different embodiment of the invention, a design pattern may be produced in a selenium layer to demonstrate application of the general method with photoconductive metals. An approximately 70 micron thick selenium layer may be selected for the embodiment and a recording member prepared by coating the metal with a photosensitive resin film. If the composite arrangement is then exposed for approximately three and one-half hours to projector illumination in a conventional resolution test pattern, the detail in a 7 line per millimeter grid configuration is visibily discernible in the selenium upon removal of the coating. This result indicates usefulness of the invention for the production of relief images, conductive circuits, and other design patterns in photoconductive layers having broad application in the entire information recording art.

*Example 6*

Still a different embodiment of the invention comprises preparation of printed circuits, relief images, and the like, in metals exhibiting electrically semiconducting characteristics. Thus, selective conversion of a semiconducting metal layer in the same general manner previously described demonstrates further utility of the invention in the area of thin film electrical circuits. A typical example is provided with a silicon layer having the photosensitive coating in direct physical contact therewith. Exposure of the composite member to projector illumination in a desired image pattern produces a copy of the projected optical image in the metal layer. A visibly discernible copy may be obtained with a silicon layer in this manner after a three and one-half hour exposure to illumination from a 300-watt tungsten lamp photographic projector.

*Example 7*

To illustrate other particularly useful compositions for practice of the invention, a photosensitive coating for the metal layer is provided with a composition containing 0.3 gram trichloromethyl sulfonyl chloride, 1.2 grams of the polystyrene material, 4.8 grams benzene, and 1.5 grams acetone. Satisfactory recording may be provided with this coating in an approximately 200 angstroms thick layer of tin. Exposure of the recording member for approximately 90 minutes to projector illumination in the desired image pattern produces selective conversion throughout the thickness of the tin layer. The particular photosensitive coating illustrated does not develop color during exposure as occurs with the polyhalogenated organic compounds employed in the preceding examples. Absence of color change is especially desirable because it minimizes optical scattering in the photosensitive layer, thereby achieving better resolution and detail of image formation in the underlying metal layer than otherwise obtainable. From past discussion, it will also be remembered that the fully transparent nature of the presently employed coating after exposure also eliminates any need for removing the coating in order to clearly observe the metal image.

The relief pattern produced in the metal layer directly upon exposure in the present process differs basically in configuration from all known prior relief images. More particularly, the present image has a point-by-point thickness correspondence with the degree of conversion achieved during exposure. In this respect, the metal thickness variation is regulated directly by the amount of irradiation received during exposure at a particular point. The significance of this feature is for greater control over both the thickness and resolution capacity in the metal layer than is possible by other methods. To further illustrate this feature, it is possible with the present process to reproduce an entire gray scale pattern containing 10 shades of gray on a 150 angstroms copper film. The result demonstrates a minimum thickness control of 15 angstroms.

When the image is produced in extremely thin metal films of around 150 angstroms and less and the conversion products removed from the exposed metal layer, a photographic transparency is obtained exhibiting all the clarity, shade tones, and detail provided with conventional photographic film. A contrast image is produced in metal layers of greater thickness even before removal of conversion products due to differences in incident light absorption and/or reflection characteristics of the materials present. Such contrast images provide directly useful decorative patterns, optical displays, ornamental designs, and the like. Printed electrical circuit patterns are produced in the metal layers by converting portions of the metal extending completely through the layer. Since conversion products produced in the various metal layers generally exhibit greater electrical resistance than unreacted metal, a satisfactory conducting path can very often be established in a metal layer still containing the conversion products. Consequently, the term "design" as used herein to describe the various patterns in a metal layer is intended to encompass all the different images produced by practice of the invention.

Suitable metals for the first metal layer may all be characterized as forming stable halides by reaction with photolytic halogen. Stable halides are produced by a broad class of metals which include many metallic elements, metal alloys, and even certain metal compounds. On the other hand, unreactive metal elements, such as the noble metals of gold, rhodium, platinum, and palladium form halides only under more rigorous conditions than herein contemplated or produce only unstable halide products. Metals having the appropriate reactivity can be selected from the class of heavy metal elements such as silver, copper, tin, lead, iron, and zinc, excluding the noble metals above mentioned together with chromium and nickel which are relatively insensitive under the contemplated exposure conditions. While certain light metal elements such as silicon and aluminum may also be selectively converted to stable halides as above demonstrated, the stable oxide layers formed readily by light metals in air can act as an effective barrier, preventing reaction between the metal and photolytic halogen. Specific metals for practice of the invention may best be selected on the basis of application intended. For decorative or image copying purposes, the speed of conversion desired generally governs the particular metal to be used. Thus, silver reacts faster than copper while copper reacts faster than tin under the above-described recording conditions. On the other hand, intrinsic properties of the metal itself or conversion products formed therefrom will generally govern metal selection for electrical circuit applications.

Useful polyhalogenated organic compounds for preparation of an image in the first metal layer may be selected from a relatively broad class of radiation-sensitive, carbon-to-carbon type compounds containing at least two halogen atoms, with each halogen atom being bonded to a carbon atom having no more than two hydrogen atoms and preferably a single hydrogen atom bonded thereto. The preferred polyhalogenated organic compounds are sensitive to photoradiation in the visible spectrum for image production with ordinary sources of illumination. The desired sensitivity to visible radiation is exhibited by alkyl hydrocarbons or substituted products thereof having a plurality of halogen atoms bonded to the same carbon atom. Typical polyhalogenated organic compounds which produce photolytic halogen when exposed to the activating radiation include substituted alkyl hydrocarbons such as iodoform, methylene iodide, and tetraiodoethylene; substitution products of alkyl hydrocarbons such as trichloromethyl sulfonyl chloride; and substituted mononuclear aromatic compounds such as chloranil. While satisfactory results are produced in a metal layer coated with the polyhalogenated organic material, a more generally useful recording member is obtained if the coating contains a binder to insure coating adhesion to the metal substrate. Coating compositions containing as little as 5 parts by weight of the polyhalogenated organic compound per 100 parts of binder produce satisfactory image patterns in a metal layer.

From the foregoing description, it is apparent that a general system for reproducing a design in the metal layer directly responsive to an impinging pattern of activating radiation has been provided. It is not intended to limit the invention to the preferred embodiments above shown, however, since it will be obvious to those skilled in the art that certain modifications of the present teachings can be made without departing from the true spirit and scope of the invention. For example, while the activating radiation employed in the above embodiments to produce image formation has been photoradiation, it is also recognized that many suitable polyhalogenated organic compounds are also sensitive to X-rays, gamma rays, ionizing radiation, and other forms of penetrating radiation. The present invention in its broadest sense, therefore, contemplates use of such less conventional radiation means. Likewise, it is contemplated to employ minor amounts of known light sensitizers in the radiation-sensitive coating for the purpose of decreasing the exposure time of recording as well as broadening the spectral region of response. A final metal image prepared by the above described general method may be further given a protective coating for prevention of oxidation, sulfurization, and other changes which might occur with extended exposure to ordinary atmospheric environment. Additionally, the surface wetting characteristics of the final metal relief is very different from the support and the product should make a useful printing plate for use with liquid inks.

It is further within contemplation of the invention to deposit additional metal on the design pattern produced in a metal layer by the general method above disclosed. Accordingly, known electrolytic or electroless deposition techniques may be used for the addition of more metal on the relief image surface if so desired. This modification of the general method also permits formation of a composite relief image with a substratum of metal and an overlying layer of a second metal. Thus, a design pattern in a copper layer can be electroplated with nickel or chromium to produce a relief image of greater thickness and less susceptibility to corrosion under ordinary ambient conditions than the copper base image. An additional advantage provided in this manner is formation of a relief image with metals that do not undergo reaction readily by the general conversion process.

It is intended to limit the present invention, therefore, only to the scope of the following claims.

What I claim as new and desire to secure by Letters Patent of the United States is:

1. A method for producing a design in a metal layer which comprises coating the metal layer with a polyhalogenated organic compound that liberates photolytic halogen when exposed to activating radiation, said metal being chemically reactable with the photolytic halogen, and selectively exposing the coated metal layer to activating radiation in the desired design pattern for a sufficient time period to react the photolytic halogen generated with the metal to produce a pattern of the product of said reaction in said metal layer which has a point-to-point correspondence with the design pattern of activating radiation.

2. A method for producing a design in a metal layer which comprises coating the metal layer with a polyhalogenated organic compound that liberates photolytic halogen when exposed to activating radiation, said metal being chemically reactable with the photolytic halogen, selectively exposing the coated metal layer to activating radiation in the desired design pattern for a sufficient time period to react the photolytic halogen generated with the metal to produce a pattern of the products of said reaction in said metal layer which has a point-to-point correspondence with the design pattern of activating radiation, and removing the coating from the metal layer along with reacted portions of the metal.

3. A method for producing a design in a metal layer which comprises coating the metal layer with a polyhalogenated organic compound that liberates photolytic halogen when exposed to activating radiation, said metal being chemically reactable with the photolytic halogen, selectively exposing the coated metal layer with activating radiation in the desired design pattern for a sufficient time period to react the photolytic halogen generated with the metal, to produce a pattern of the products of said reaction in said metal layer which has a point-to-point correspondence with the design pattern of activating radiation, and dissolving the coating from the metal layer along with the reacted portions of the metal with a liquid solvent which does not dissolve the metal.

4. A method for producing a design in a metal layer which comprises coating the metal layer with a thermoplastic resin film containing a polyhalogenated organic compound that liberates photolytic halogen when exposed to activating radiation, said metal being chemically reactable with the photolytic halogen, selectively exposing the coated metal layer to activating radiation in the desired design pattern for a sufficient time period to react the photolytic halogen generated with the metal to produce a pattern of the products of said reaction in said metal layer which has a point-to-point correspondence with the design pattern of activating radiation, and removing the coating from the metal layer along with reacted portions of the metal.

5. A method for producing a printed electrical circuit which comprises coating a metal layer supported on a dielectric substrate with a polyhalogenated organic compound that liberates photolytic halogen when exposed to activating radiation, said metal being chemically reactable with the photolytic halogen, selectively exposing the coated metal layer to activating radiation in the desired circuit pattern for a sufficient time period to react the photolytic halogen generated with the metal substantially throughout the thickness of the metal layer to produce a pattern of the products of said reaction in said metal layer which has a point-to-point correspondence with the circuit pattern of activating radiation, and removing the coating from the metal layer along with reacted portions of the metal.

6. A method for producing a printed electrical circuit which comprises coating a metal layer supported on a dielectric substrate with a thermoplastic film containing the polyhalogenated organic compound that liberates photolytic halogen when exposed to activating radiation, said metal being chemically reactable with the photolytic halogen, selectively exposing the coated metal layer to activating radiation in the desired circuit pattern for a sufficient time period to react the photolytic halogen generated with the metal substantially throughout the thickness of the metal layer to produce a pattern of the products of said reaction in said metal layer which has a point-to-point correspondence with the circuit pattern of activating radiation and removing the coating from the metal layer along with reacted portions of the metal.

7. A method for producing a light and shadow image in an extremely thin supported metal film which comprises coating the metal film with a polyhalogenated organic compound that liberates photolytic halogen when exposed to activating radiation, said metal being chemically reactable with the photolytic halogen, and selectively exposing the coated film to activating radiation in the desired light and shadow pattern for a sufficient time period to react the photolytic halogen generated with the metal to produce a pattern of the products of said reaction in said metal layer which has a point-to-point correspondence with the light and shadow pattern wherein the thickness of the reaction products in any given area of said pattern is substantially directly related to the intensity of the radiation to which said area was exposed.

8. A method for producing a light and shadow image in an extremely thin supported metal film which comprises coating the metal film with a clear thermoplastic film containing a polyhalogenated organic compound that liberates photolytic halogen when exposed to activating radiation without discoloration, said metal being chemically reactable with the photolytic halogen, and selectively exposing the coated film to activating radiation in the desired light and shadow pattern for a sufficient time period to react the photolytic halogen generated with the metal to produce a pattern of the products of said reaction in said metal layer which has a point-to-point correspondence with the light and shadow pattern wherein the thickness of the reaction products in any given area of said pattern is substantially directly related to the intensity of the radiation to which said area was exposed.

9. A method for producing a design in a metal layer which comprises coating the metal layer with a polyhalogenated organic compound that liberates photolytic halogen when exposed to activating radiation, said metal being chemically reactable with the photolytic halogen, selectively exposing the coated metal layer to activating radiation in the desired design pattern for a sufficient time period to react the photolytic halogen generated with the metal to product a pattern of the products of said reaction in said metal layer which has a point-to-point correspondence with the design pattern of activating radiation, removing the coating from the metal layer along with reacted portions of the metal, and depositing metal on the surface of the metal layer.

10. A method for producing a design in a metal layer which comprises coating the metal layer with a polyhalogenated organic compound that liberates photolytic halogen when exposed to activating radiation, said metal being chemically reactable with the photolytic halogen, selectively exposing the coated metal layer with activating radiation in the desired design pattern for a sufficient time period to react the photolytic halogen generated with the metal to produce a pattern of the products of said reaction in said metal layer which has a point-to-point correspondence with the design pattern of activating radiation, dissolving the coating from the metal layer along with the reacted portions of the metal with a liquid solvent which does not dissolve the metal, and depositing metal on the surface of the metal layer.

11. A method for producing a design in a metal layer which comprises coating the metal layer with a polyhalogenated organic compound that liberates photolytic halogen when exposed to activating radiation, said metal being chemically reactable with the photolytic halogen, selectively exposing the coated metal layer to activating radiation in the desired design pattern for a sufficient time period to react the photolytic halogen generated with the metal to produce a pattern of the products of said reaction in said metal layer which has a point-to-point correspondence with the design pattern of activating radiation, removing the coating from the metal layer along with reacted portions of the metal layer, and depositing a dissimilar metal on the surface of the metal layer.

References Cited

UNITED STATES PATENTS

| | | | |
|---|---|---|---|
| 1,574,358 | 2/1926 | Beebe | 96—35 |
| 1,574,359 | 2/1926 | Beebe et al. | 96—35 |
| 1,587,274 | 6/1926 | Beebe et al. | 96—35 |
| 2,854,386 | 9/1958 | Lyman et al. | 96—35 |
| 2,914,404 | 11/1959 | Fanselau et al. | 96—35 |
| 3,020,156 | 2/1962 | Rowe | 96—35 |
| 3,046,125 | 7/1962 | Wainer | 96—90 |
| 3,135,046 | 6/1964 | Stookey | 217—213 |
| 3,154,415 | 10/1964 | Kaulen | 96—36 |

OTHER REFERENCES

Mees: The Theory of the Photographic Process, Revised Edition 1954, The MacMillan Company, N.Y., pp. 3–5 and 503–511.

Mees: "The Theory of the Photographic Process," Revised Edition 1954, The MacMillan Co., N.Y., pp. 243, 252–253, 262–263, and 275–276.

NORMAN G. TORCHIN, *Primary Examiner.*

ALEXANDER D. RICCI, *Examiner.*

C. L. BOWERS, Jr., *Assistant Examiner.*